United States Patent
Hyde et al.

(10) Patent No.: US 7,846,781 B2
(45) Date of Patent: Dec. 7, 2010

(54) DELETABLE NANOTUBE CIRCUIT

(75) Inventors: Roderick A. Hyde, Livermore, CA (US); Muriel Y. Ishikawa, Livermore, CA (US); Nathan P. Myhrvold, Medina, WA (US); Clarence T. Tegreene, Bellevue, WA (US); Charles Whitmer, North Bend, WA (US); Lowell L. Wood, Jr., Livermore, CA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 184 days.

(21) Appl. No.: 12/229,993

(22) Filed: Aug. 27, 2008

(65) Prior Publication Data

US 2009/0124049 A1    May 14, 2009

Related U.S. Application Data

(60) Division of application No. 11/314,738, filed on Dec. 20, 2005, which is a continuation-in-part of application No. 11/314,718, filed on Dec. 20, 2005, now Pat. No. 7,696,505, and a continuation-in-part of application No. 11/314,751, filed on Dec. 20, 2005, now Pat. No. 7,721,242.

(51) Int. Cl.
   *H01L 29/02* (2006.01)
(52) U.S. Cl. ............ 438/128; 257/4; 257/E51.04; 423/447.1; 977/842; 977/750; 438/800
(58) Field of Classification Search ............ 257/4, 257/E51.04; 438/128, 800; 423/447.1; 977/842, 977/750
See application file for complete search history.

(56) References Cited

U.S. PATENT DOCUMENTS

| | | | | |
|---|---|---|---|---|
| 4,581,315 A | * | 4/1986 | Garito | ............ 430/269 |
| 6,239,547 B1 | * | 5/2001 | Uemura et al. | ............ 313/495 |
| 6,781,166 B2 | * | 8/2004 | Lieber et al. | ............ 257/211 |
| 6,963,077 B2 | | 11/2005 | DeHon et al. | |
| 2002/0122765 A1 | | 9/2002 | Horiuchi et al. | |
| 2003/0089899 A1 | | 5/2003 | Lieber et al. | |
| 2003/0165418 A1 | | 9/2003 | Ajayan et al. | |
| 2004/0026007 A1 | | 2/2004 | Hubert et al. | |
| 2005/0112051 A1 | | 5/2005 | Liu et al. | |
| 2005/0117441 A1 | | 6/2005 | Lieber et al. | |
| 2005/0238566 A1 | | 10/2005 | Rao et al. | |
| 2005/0253137 A1 | | 11/2005 | Whang et al. | |
| 2007/0004191 A1 | * | 1/2007 | Gu et al. | ............ 438/618 |
| 2008/0017845 A1 | | 1/2008 | Drndic et al. | |

OTHER PUBLICATIONS

PCT International Search Report; International App. No. PCT/US 06/48212, Oct. 31, 2008; pp. 1-2.
Bachtold, Adrian; Hadley, Peter; Nakanishi, Takeshi; Dekker, Cees; "Logic Circuits with Carbon Nanotube Transistors"; Science; Nov. 2001; pp. 1317-1320; vol. 294.

(Continued)

*Primary Examiner*—Bradley K Smith
*Assistant Examiner*—Jami M Valentine
(74) *Attorney, Agent, or Firm*—Suiter Swantz pc llo

(57) ABSTRACT

Carbon nanotube template arrays may be edited to form connections between proximate nanotubes and/or to delete undesired nanotubes or nanotube junctions.

12 Claims, 3 Drawing Sheets

OTHER PUBLICATIONS

Dehon, Andre; "Array-Based Architecture for FET-Based, Nanoscale Electronics"; IEEE Transactions on Nanotechnology; Mar. 2003; pp. 23-32; vol. 2, No. 1.

Dwyer, Chris; Guthold, Martin; Falvo, Michael; Washburn, Sean; Superfine, Richard; Erie, Dorothy; "DNA-functionalized single-walled carbon nanotubes"; Nanotechnology; 2002; pp. 601-604; vol. 13; Institute of Physics Publishing, published Sep. 6, 2002.

Dwyer, Chris; Vicci, Leandra; Poulton, John; Erie, Dorothy; Superfine, Richard; Washburn, Sean; Taylor, II, Russell M.; "The Design of DNA Self-Assembled Computing Circuitry"; IEEE Transactions on VLSI; Nov. 2004; pp. 1214-1220; vol. 12, No. 11.

Fu, Qiang; Lu, Chenguang; Liu, Jie; "Selective Coating of Single Wall Carbon Nanotubes with Thin SiO2 Layer"; Nano Letters; 2002; pp. 329-332; vol. 2, No. 4, published online Mar. 26, 2002.

Fuhrer, M.S.; Nygard, J.; Shih, L.; Forero, M.; Yoon, Young-Gui; Mazzoni, M.S.C.; Choi, Hyoung Joon; Ihm, Jisoon; Louie, Steven G.; Zettl, A.; McEuen, Paul L.; "Crossed Nanotube Junctions"; Science; Apr. 2000; pp. 494-497; vol. 288.

Guan, Jingjiao; Lee, L. James; "Generating highly ordered DNA nanostrand arrays"; PNAS; bearing dates of Aug. 10, 2005, Nov. 2, 2005 and Dec. 20, 2005; pp. 18321-18325; vol. 102, No. 51; located at www.pnas.org_cgi_doi_10.1073_pnas.0506902102.

Kuekes, Philip J.; Snider, Gregory S.; Williams, R. Stanley; "Nanocomputers Crossbar; Crisscrossing assemblies of defect-prone nanowires could succeed today's silicon-based circuits"; Scientific American; Nov. 2005; pp. 72-80; vol. 293, No. 5.

Liu, Dage; Reif, John H.; Labean, Thomas H.; "DNA Nanotubes: Construction and Characterization of Filaments Composed of TX-tile Lattice"; In the $8^{th}$ International Meeting on DNA Based Computers (DNA 8), Sapparo, Japan; Jun. 2002; pp. 1-13.

Lustig, Steven R.; Boyes, Edward D.; French, Roger H.; Gierke, Timothy D.; Harmer, Mark A.; Hietpas, Paula B.; Jagota, Anand; McLean, R. Scott; Mitchell, Greg P.; Onoa, G. Bibiana; Sams, Kerry D.; "Lithographically Cut Single-Walled Carbon Nanotubes: Controlling Length Distribution and Introducing End-Group Functionality"; Nano Letters; 2003; pp. 1007-1012; vol. 3, No. 8.

Papadopoulos, C; Rakitin, A.; Li, J.; Vedeneev, A.S.; Xu, J.M.; "Electronic Transport in Y-Junction Carbon Nanotubes"; Physical Review Letters; Oct. 16, 2000; pp. 3476-3479; vol. 85, No. 16; The American Physical Society.

Tans, Sander J.; Verschueren, Alwin R.M.; Dekker, Cees; "Room-temperature transistor based on a single carbon nanotube"; Nature; 1998; pp. 49-52; vol. 393.

Yan, Hao; Park, Sung Ha; Finkelstein, Gleb; Reif, John H.; Labean, Thomas H.; "DNA-Templated Self-Assembly of Protein Arrays and Highly Conductive Nanowires"; Science; Sep. 2003; pp. 1882-1884; vol. 301.

Zheng, Ming; Jagota, Anand; Strano, Michael S.; Santos, Adelina P.; Barone, Paul; Chou, S. Grace; Diner, Bruce A.; Dresselhaus, Mildred S.; McLean, Robert S.; Onoa, G. Bibiana; Samsonidze, Georgii G.; Semke, Ellen D.; Usrey, Monica; Walls, Dennis J.; "Structure-Based Carbon Nanotube Sorting by Sequence-Dependent DNA Assembly"; Science; Nov. 2003; pp. 1545-1548; vol. 302.

UK Intellectual Property Office Examination Report Under Section 18(3); App. No. GB0812771.4; Jul. 16, 2010; pp. 1-3.

\* cited by examiner

DELETABLE NANOTUBE CIRCUIT

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a divisional of U.S. patent application Ser. No. 11/314,738, entitled DELETABLE NANOTUBE CIRCUIT, naming Roderick A. Hyde, Muriel Y. Ishikawa, Nathan P. Myhrvold, Clarence T. Tegreene, Charles Whitmer, and Lowell L. Wood, Jr., as inventors, filed 20 Dec. 2005, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/314,718, entitled CONNECTIBLE NANOTUBE CIRCUIT, naming Roderick A. Hyde, Muriel Y. Ishikawa, Nathan P. Myhrvold, Clarence T. Tegreene, Charles Whitmer, and Lowell L. Wood, Jr. as inventors, filed 20 Dec. 2005, now U.S. Pat. No. 7,696,505, or is an application of which a currently co-pending application is entitled to the benefit of the filing date.

For purposes of the USPTO extra-statutory requirements, the present application constitutes a continuation-in-part of U.S. patent application Ser. No. 11/314,751, entitled NANOTUBE CIRCUIT ANALYSIS SYSTEM AND METHOD, naming Roderick A. Hyde, Muriel Y. Ishikawa, Nathan P. Myhrvold, Clarence T. Tegreene, Charles Whitmer, and Lowell L. Wood, Jr. as inventors, filed 20 Dec. 2005, now U.S. Pat. No. 7,721,242, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present applicant entity has provided above a specific reference to the application(s) from which priority is being claimed as recited by statute. Applicant entity understands that the statute is unambiguous in its specific reference language and does not require either a serial number or any characterization, such as "continuation" or "continuation-in-part," for claiming priority to U.S. patent applications. Notwithstanding the foregoing, applicant entity understands that the USPTO's computer programs have certain data entry requirements, and hence applicant entity is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

BACKGROUND

According to the International Technology Roadmap for Semiconductors (ITRS), device sizes will continue to shrink, roughly in accordance with Moore's Law (which predicts a doubling of the number of transistors per unit area every 1.5-2 years). As device size requirements grow ever more stringent, traditional silicon lithography techniques may become inadequate, requiring a shift in materials and/or in circuit design techniques to keep pace with demands for improved performance.

SUMMARY

In one aspect, a method of constructing a circuit comprises providing an array of carbon nanotubes including a plurality of segments. At least a subset of the segments intersect to form electrically responsive junctions. The method further includes selectively inactivating at least one segment or junction. Inactivating may including application of electromagnetic energy (e.g., by directing a laser towards the segment or junction), application of an electron beam, chemical attack (e.g., by an activatable composition such as a photochemical, an enzyme, or a targetable composition such as a nucleotide-containing composition), and/or application of a voltage. Application of a voltage may include applying the voltage to segments and/or to junctions, and may include application of timed pulses, which may be timed to temporally overlap at a common center (such as the segment or junction to be inactivated). The carbon nanotubes may be arranged, for example, in a rectilinear array, a hexagonal pattern, or a three dimensional pattern, and may include junctions connecting at least or exactly three segments. Providing the array of carbon nanotubes may include growing the carbon nanotubes along selected paths. The carbon nanotubes may include semiconducting nanotubes and/or metallic nanotubes. The method may further include measuring an electrical property of at least one segment or junction, and may in addition selecting a segment or junction to inactivate in response to the measured electrical property.

In another aspect, a carbon nanotube circuit template includes a plurality of carbon nanotube segments that interconnect to form junctions. At least one of the segments or at least one of the junctions exhibits a nonlinear current-voltage response, and at least one of the segments or at least one of the junctions is deletable. The carbon nanotubes may be arranged, for example, in a rectilinear array, a hexagonal pattern, or a three dimensional pattern, and may include junctions connecting at least or exactly three segments. The carbon nanotubes may include at least one semiconducting segment and/or at least one metallic segment. At least one of the carbon nanotubes may be deletable by application of electromagnetic energy (e.g., by directing a laser towards the segment or junction), application of an electron beam, chemical attack (e.g., by an activatable composition such as a photochemical, an enzyme, or a targetable composition such as a nucleotide-containing composition), and/or application of a voltage.

DETAILED DESCRIPTION

Figure 1:
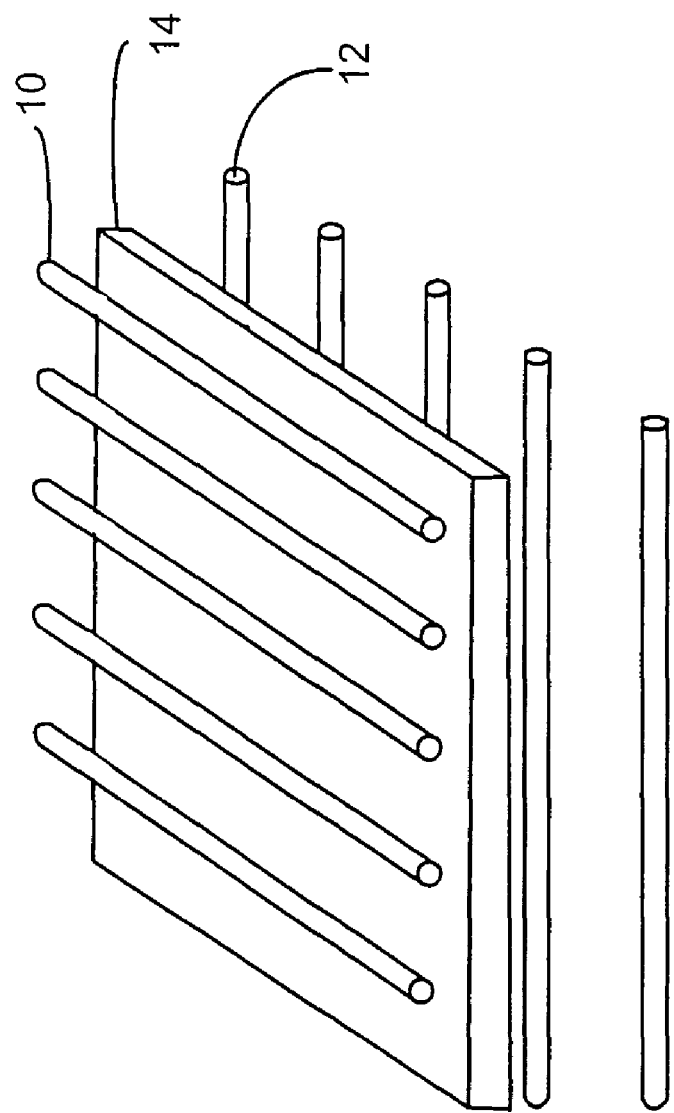
FIG. 1 is a schematic of a template device.

Carbon nanotubes represent an attractive candidate material for dramatically reducing device sizes. They have been shown to exhibit diode-like properties when "kinks" (pentagon-heptagon defect pairs) are introduced (see, e.g., Yao et al., "Carbon nanotube intramolecular junctions," *Nature* 402: 273-276 (November 1999), incorporated by reference herein), and crossed nanotubes may act as nanoscale p-type Schottky diodes (see, e.g., Fuhrer, et al., "Transport through crossed nanotubes," *Physica E* 6:868-871 (2000), hereinafter referred to as "Fuhrer I," Fuhrer, et al., "Crossed Nanotube Junctions," *Science* 288:494-497 (April 2000), hereinafter referred to as "Fuhrer II," and Patwardhan, et al., "Circuit and System Architecture for DNA-Guided Self-Assembly of Nanoelectronics," *Proc. 1st Conf. Foundations of Nanosci.* 344-358 (April 2004), all of which are incorporated herein by reference).

Single-walled carbon nanotubes (SWCNTs) may be metallic or semiconducting depending on their chirality. Individual SWCNTs have a chirality defined by circumferential vector (n,m) in terms of graphite lattice units. When (n−m)/3 is an integer, the SWCNTs generally behave as metals, while other SWCNTs generally behave as semiconductors. Fuhrer II found three types of behavior for crossed SWCNTs, depending on whether the constituent CNTs were metallic-metallic (MM), semiconducting-semiconducting (SS), or metallic-semiconducting (MS). MM junctions and SS junctions exhibited roughly linear I-V behavior, with MM conductivities in the range of 0.086-0.26 $e^2/h$ and SS conductivities in the range of at least 0.011-0.06 $e^2/h$. MS junctions exhibited nonlinear I-V behavior, with much lower conductivities in the linear range and with a Schottky barrier of 190-290 meV. Theoretical calculations (see, e.g., Buldum, et al. "Contact resistance between carbon nanotubes," *Phys. Rev. B* 63:161403 (R) (April 2001), incorporated herein by reference) suggest that the conductivity of such junctions may be a sensitive function of atomic structure in the contact region (e.g., registration of hexagon structures in adjacent nanotubes).

CNTs may also be fabricated in a Y-shape, in which three nanotubes converge at a junction (see, e.g., Papadapoulos "Electronic Transport in Y-Junction Carbon Nanotubes," *Phys. Rev. Lett.* 85(16):3476-3479, incorporated herein by reference). Such systems (and the special subset of T-shaped junctions) have been computationally modeled and found to exhibit current rectification (see, e.g., Srivastava, et al., "Computational Nanotechnology with Carbon Nanotubes and Fullerenes," *Comp. Sci. Eng* 3(4):42-55 (July/August 2001), incorporated herein by reference). Experimental results (Papadapoulos, supra) confirm rectifying behavior.

The rectifying structures described above may be combined to form more complex circuit elements (e.g., logic gates, such as those described in Derycke, et al., "Carbon Nanotube Inter- and Intramolecular Logic Gates," *Nano Lett.*, 1(9):453-456 (August 2001), incorporated herein by reference) and circuits (e.g., a scalable one-bit adder, described in Patwardhan, supra), using conventional circuit design principles.

As shown in FIG. 1, a template device comprises two arrays of CNTs 10, 12 set at an angle to one another (90 degrees as shown, but other angles may also be used). An intermediate layer 14 is interposed between the two arrays of CNTs. (FIG. 1 is shown in exploded view for clarity; in most embodiments, the CNTs 10, 12 will be in contact or at least in close proximity to intermediate layer 14.) As shown, the intermediate layer 14 is a flat layer, but in other embodiments, it may be a coating on the CNTs or have any other physical configuration that interposes it between CNTs of the two arrays. The CNTs of each array may be metallic, semiconducting, or a mixture of both types. In the configuration shown in FIG. 1, the CNTs of the first array 10 are insulated from the CNTs of the second array 12 by the intermediate layer.

Figure 2:
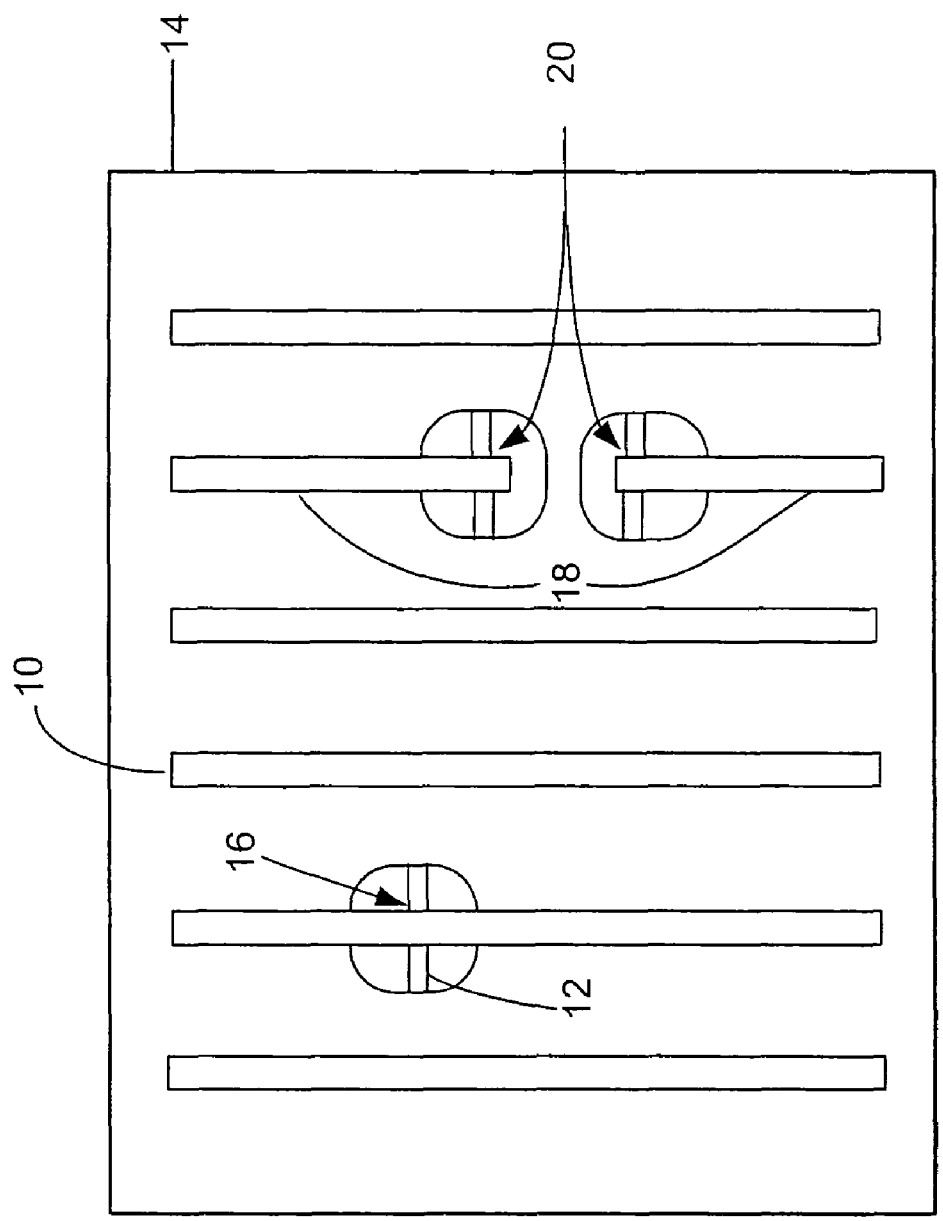
FIG. 2 is a schematic of the template device of FIG. 1 after selective editing.

FIG. 2 shows a plan view of the template device of FIG. 1 after selective editing of the intermediate layer 14. As seen at junction 16, the intermediate layer is removed, allowing a CNT of the first array 10 and a CNT of the second array 12 to contact one another to form a junction. In addition, segment of CNT 18 has been removed between two additional junctions 20. In some embodiments, segments or junctions may be removed by an electron beam, ion beam, and/or a laser beam, either by direct etching or by illumination followed by a chemical development process. In other embodiments, segments or junctions may be removed by application of a voltage, for example by application of one or more timed pulses along the CNTs that are selected to temporally overlap at a common center, or by application of a voltage directly to a junction or segment. By selecting junctions at which the CNTs may be connected and segments or junctions in which they may be removed, complex circuits of CNTs can be built up in the template. In other embodiments, additional intermediate layers and CNT arrays may be added to increase the available complexity.

The intermediate layer 14 may comprise any material that serves to separate the CNTs and that can be selectively removed or deactivated. In some embodiments, the intermediate layer may comprise a resist composition, which may be removed by conventional lithographic techniques (including but not limited to photoresist, e-beam resist, or X-ray resist). In other embodiments, the resist may comprise a material that can be locally removed or deactivated by application of a voltage between the first selected CNT and the second CNT, potentially obviating the need for lithographic systems.

The arrays of CNTs 10 and 12 may be formed by a variety of methods, including but not limited to pick-and-place, self-assembly of already-formed CNTs (e.g., by the methods of Dwyer, et al., "The Design of DNA Self-Assembled Computing Circuitry," *IEEE Trans. VLSI Sys.*, 12(11):1214-1220 (November 2004), incorporated herein by reference), or in situ growth of CNTs (e.g., by the methods of Jung, et al., "Mechanism of Selective Growth of Carbon Nanotubes on $SiO_2$/Si Patterns," *Nano Lett.* 3(4):561-564 (March 2003), incorporated herein by reference). Some of these methods may lend themselves to production of CNTs having particular chiralities and/or conductivities, while others may produce arrays of CNTs having a distribution of chiralities and/or conductivities.

In embodiments where the chiralities and/or conductivities are not known a priori, it may be desirable to interrogate the material properties of individual CNTs in order to determine appropriate connections and/or deletions (e.g., by electrical testing, plasmon interactions, optical testing, atomic force microscopy, and/or other types of microscopy). In still other embodiments, it may be desirable to interrogate properties of individual CNTs or of groups of CNTs to locate regions having desired properties after some or all of the connections and/or deletions have been made. In yet other embodiments, it may be desirable to examine physical properties, as well as or instead of electrical properties, of CNTs and junction during any point in the process to determine additional connections and/or deletions or other configurational aspects. Physical properties may include, but are not limited to, location, size, defect location, and/or chemical environment.

Figure 3:
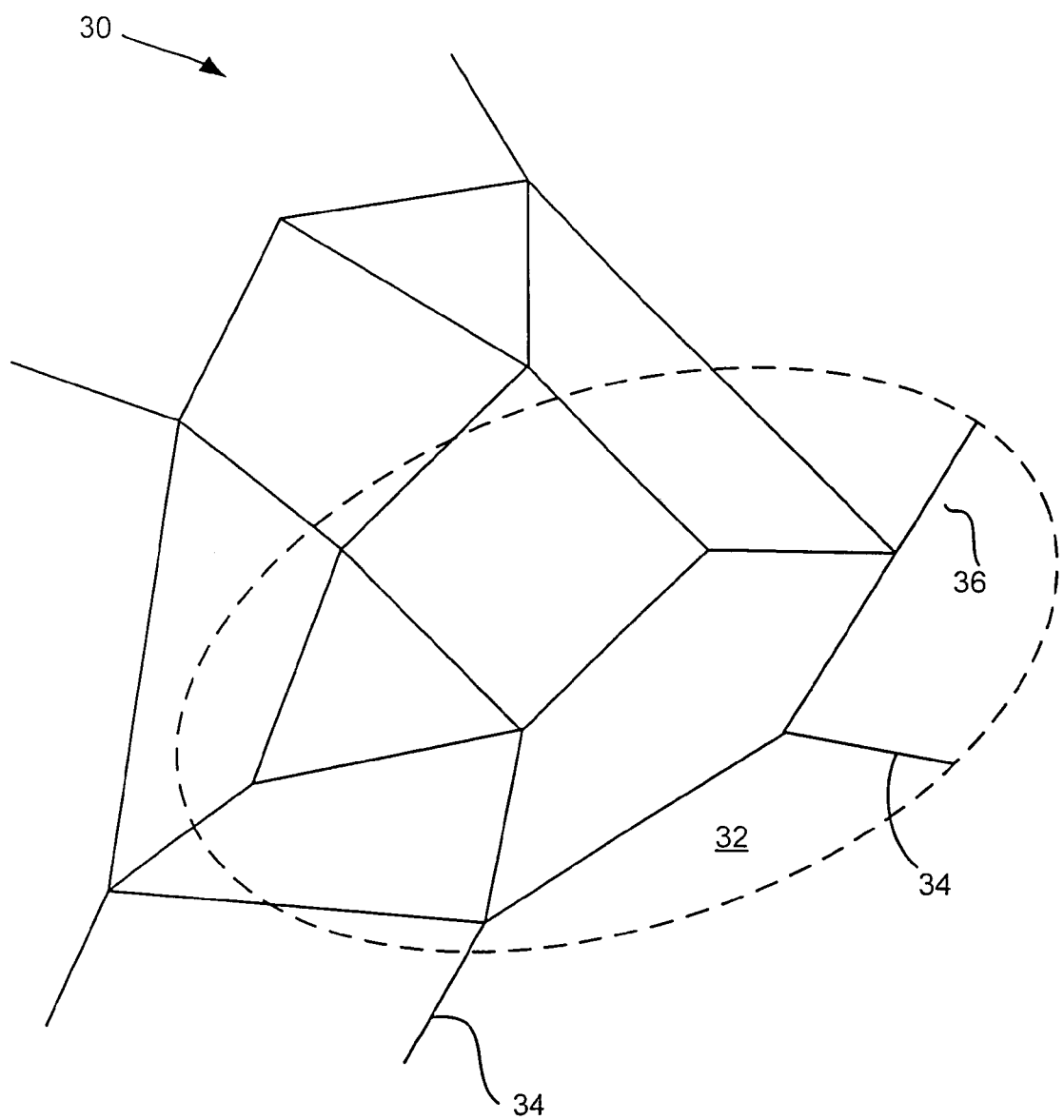
FIG. 3 is a schematic of an interconnected set of carbon nanotubes (CNTs).

FIG. 3 shows an interconnected set of CNTs including Y junctions 30. Such an interconnected set may be produced, for example, by welding of long nanotubes (see, e.g., Terrones, et al., "Molecular Junctions by Joining Single-Walled Carbon Nanotubes," *Phys. Rev. Lett.* 89(7):075505 (August 2002), and Krasheninnikov, et al., "Ion-irradiation induced welding of carbon nanotubes," *Phys. Rev. B,* 66:245403 (2002), both of which are incorporated herein by reference). Arrays of Y-branched CNTs have also been produced by Papadopoulos, supra; these can be interconnected by similar techniques, or by the selective interconnection technique illustrated in FIGS. 1 and 2. In some embodiments, production of such interconnected sets of CNTs may be effectively random, while in other embodiments, CNTs may be interconnected in a predictable pattern.

In either case, sections 32 of the interconnected set 30 may be determined to act as logic gates or other desired circuit elements or circuits. In some embodiments, such sections may be located by determination of the chirality and/or conductivity of individual segments within the interconnected set by empirically determining the electrical properties of a interconnected set through application of voltages to selected "input" CNTs 34 and measurement of selected "output" CNTs 36, or by a combination of these methods (e.g., by determining chirality of selected "input" and "output" CNTs, identifying interconnecting junctions between them, and applying signals to the CNTs to determine behavior of the set of input CNTs, output CNTs, and interconnecting junctions). In some embodiments, segments or junctions of the interconnected set 30 may be deleted as discussed above. Such deletion may occur before, during, or after any measurement of properties of the interconnected set.

In a large interconnected set 30, many sections 32 having desired circuit properties may be present (either by design and controlled self-assembly, or by chance). Once identified as discussed above, these sections may be isolated from the interconnected set, either physically (by cutting junctions outside the desired section and moving it to a desired location), or effectively, by disconnecting segments of junctions not in the desired section to leave only continuous CNTs (which may function as leads) connected to the desired section inputs and outputs.

In some embodiments, template structures such as those shown in FIGS. 1 and 3 may be constructed in bulk, and then individually edited to form custom circuits. In such embodiments (and in particular in embodiments in which the chiralities and/or conductivities of individual CNTs are not known a priori), the determination of which CNT sections to connect and/or delete may be made using customized software.

In some embodiments, the customized software accesses a model of a CNT template structure (using measurements of properties of CNTs in the particular template if appropriate) and identifies the effect of editing the CNT template structure, either by deleting segments or junctions, or by forming connections between segments in physical proximity. The model includes the electrical behavior of the CNT segments and junctions of the template (e.g., the rectifying properties or lack thereof of individual junctions, and/or the conductivities of the CNT segments).

In some embodiments, the customized software may determine circuit behavior from first principles. In other embodiments, the software may store schematics for building block structures (including by way of nonlimiting example the logic gates and adders discussed above), and allow circuit designers to specify circuit designs using conventional methods. The software then locates regions within the model of the template structure that could be modified as discussed above to implement the particular designs. In some embodiments, a computer-based system may then control the application of voltages, dynamic masks, serial e-beam etchers, or whatever other editing tools were appropriate to produce the desired circuit on a particular template structure.

Those having skill in the art will recognize that the state of the art of circuit design has progressed to the point where there is typically little distinction left between hardware and software implementations of aspects of systems. The use of hardware or software is generally a design choice representing tradeoffs between cost, efficiency, flexibility, and other implementation considerations. Those having skill in the art will appreciate that there are various vehicles by which processes, systems and/or other technologies involving the use of logic and/or circuits can be effected (e.g., hardware, software, and/or firmware, potentially including CNT-based circuits in whole or in part), and that the preferred vehicle will vary with the context in which the processes, systems and/or other technologies are deployed. For example, if an implementer determines that speed is paramount, the implementer may opt for a mainly hardware and/or firmware vehicle. Alternatively, if flexibility is paramount, the implementer may opt for a mainly software implementation. In these or other situations, the implementer may also opt for some combination of hardware, software, and/or firmware, potentially including CNT-based circuits in whole or in part. Hence, there are several possible vehicles by which the processes, devices and/or other technologies involving logic and/or circuits described herein may be effected, none of which is inherently superior to the other. Those skilled in the art will recognize that optical aspects of implementations may require optically-oriented hardware, software, and or firmware.

Other embodiments of the invention will be apparent to those skilled in the art from a consideration of the specification or practice of the invention disclosed herein. It is intended that the specification be considered as exemplary only, with the true scope and spirit of the invention being indicated by the following claims.

What is claimed is:

1. A method of constructing a circuit, comprising:
   providing an array of carbon nanotubes (CNTs) comprising a plurality of segments, at least a subset of the segments intersecting to form electrically responsive junctions; and
   selectively inactivating at least one segment or junction, wherein inactivating at least one segment or junction includes chemically attacking the at least one segment or junction, wherein chemically attacking the at least one segment or junction includes:
   applying an activatable composition to the at least one segment or junction, and
   selectively activating the activatable composition, and
   wherein the activatable composition includes a nucleotide.

2. A method of constructing a circuit, comprising:
   providing an array of carbon nanotubes (CNTs) comprising a plurality of segments, at least a subset of the segments intersecting to form electrically responsive junctions; and selectively inactivating at least one segment or junction, wherein inactivating at least one segment or junction includes chemically attacking the at least one segment or junction, wherein chemically attacking the at least one segment or junction includes:

applying an activatable composition to the at least one segment or junction, and selectively activating the activatable composition, and wherein the activatable composition is an enzyme.

3. The method of claim 1, wherein the CNTs are arranged in a rectilinear array.

4. The method of claim 1, wherein the CNTs are arranged in a hexagonal pattern.

5. The method of claim 1, wherein the CNTs are arranged in a three-dimensional pattern.

6. The method of claim 1, wherein the CNTs include at least one junction connecting at least three segments.

7. The method of claim 1, wherein the CNTs include at least one junction connecting exactly three segments.

8. The method of claim 1, wherein providing the array of CNTs comprises growing the CNTs along selected paths.

9. The method of claim 1, wherein the CNTs comprise at least one semiconducting CNT.

10. The method of claim 1, wherein the CNTs comprise at least one metallic CNT.

11. The method of claim 1, further comprising measuring an electrical property of at least segment or one junction.

12. The method of claim 11, wherein inactivating at least one segment or junction comprises selecting the at least one segment or junction in response to the measured electrical property.

* * * * *